(12) United States Patent
Choi et al.

(10) Patent No.: US 9,746,765 B2
(45) Date of Patent: Aug. 29, 2017

(54) EXTERIOR DÉCOR PANEL FOR HOME APPLIANCE AND METHOD OF MANUFACTURING THE SAME

(71) Applicant: LG Electronics Inc., Seoul (KR)

(72) Inventors: Wonseok Choi, Seoul (KR); Taihun Lim, Seoul (KR); Seonkyu Kim, Seoul (KR); Bonghyang Kim, Seoul (KR)

(73) Assignee: LG Electronics Inc., Seoul (KR)

(*) Notice: Subject to any disclaimer, the term of this patent is extended or adjusted under 35 U.S.C. 154(b) by 156 days.

(21) Appl. No.: 14/533,295

(22) Filed: Nov. 5, 2014

(65) Prior Publication Data

US 2015/0132598 A1    May 14, 2015

(30) Foreign Application Priority Data

Nov. 8, 2013  (KR) .................. 10-2013-0135452

(51) Int. Cl.
*C25F 3/16* (2006.01)
*C25F 3/02* (2006.01)
(Continued)

(52) U.S. Cl.
CPC ............. *G03F 7/0002* (2013.01); *C25F 3/16* (2013.01); *C25F 3/20* (2013.01); *C25F 3/24* (2013.01);
(Continued)

(58) Field of Classification Search
CPC .................. C25F 7/00; C25F 3/02; C25F 3/16
(Continued)

(56) References Cited

U.S. PATENT DOCUMENTS

| 3,864,238 A | 2/1975 | Nash et al. |
| 7,767,074 B2 * | 8/2010 | Bierings ................. C25F 3/02 |
| | | 205/640 |

(Continued)

FOREIGN PATENT DOCUMENTS

| CN | 1554215 | 12/2004 |
| CN | 101174090 | 5/2008 |

(Continued)

OTHER PUBLICATIONS

European Search Report dated Mar. 19, 2015 from corresponding European Patent Application No. 14191603.1, 10 pages.

(Continued)

*Primary Examiner* — Nicholas A Smith
(74) *Attorney, Agent, or Firm* — Fish & Richardson P.C.

(57) ABSTRACT

Manufacturing an exterior décor panel for a home appliance includes laminating a photosensitive dry film on a front surface of a metal sheet, the photosensitive dry film having a higher etch resistance than the metal sheet against an electrolytic solution, photo-masking the photosensitive dry film attached to the metal sheet to create a pattern having a minimum width of 0.1 mm in the photosensitive dry film to thereby expose the front surface of the metal sheet corresponding to the pattern in the photosensitive film, electrolytic-polishing the photo-masked metal sheet by dipping the photo-masked metal sheet in an electrolytic bath to allow the electrolytic solution to contact the exposed front surface of the metal sheet and form the pattern in the front surface of the metal sheet, and performing post-treatment on the metal sheet, the post-treatment including washing and removing the photosensitive dry film.

11 Claims, 6 Drawing Sheets

(51) Int. Cl.
*C25F 7/00* (2006.01)
*G03F 7/00* (2006.01)
*C25F 3/20* (2006.01)
*C25F 3/24* (2006.01)
*F25D 23/02* (2006.01)

(52) U.S. Cl.
CPC ............... *C25F 7/00* (2013.01); *F25D 23/02* (2013.01); *F25D 2323/02* (2013.01); *F25D 2400/18* (2013.01); *Y10T 428/12389* (2015.01)

(58) Field of Classification Search
USPC .......... 205/667; 204/291.01, 297.05, 297.06
See application file for complete search history.

(56) References Cited

U.S. PATENT DOCUMENTS

| | | | | |
|---|---|---|---|---|
| 2003/0036016 | A1* | 2/2003 | Szmanda | C08J 7/02 430/270.1 |
| 2003/0141267 | A1* | 7/2003 | Lloyd | C25D 17/06 211/113 |
| 2005/0082257 | A1 | 4/2005 | Bierings et al. | |
| 2007/0187258 | A1* | 8/2007 | Du | B23H 5/08 205/646 |
| 2009/0131262 | A1* | 5/2009 | Zhang | H01L 39/143 505/237 |

FOREIGN PATENT DOCUMENTS

| | | | |
|---|---|---|---|
| CN | 101490861 | 7/2009 | |
| CN | 103313520 | 9/2013 | |
| DE | EP 1443129 A1 * | 8/2004 | ............... B05D 7/14 |
| EP | 1443129 A1 | 8/2004 | |
| KR | 10-1047366 B1 | 7/2011 | |

OTHER PUBLICATIONS

Office Action issued in Chinese Application No. 201410643464.4 on Aug. 16, 2016, 18 pages (with English translation).
Silicon Photonics, editor in chief: (US) Zhiping Zhou, Peking University Press, pp. 260-276, Dec. 2012.

* cited by examiner (a)   (b)

EXTERIOR DÉCOR PANEL FOR HOME APPLIANCE AND METHOD OF MANUFACTURING THE SAME

CROSS-REFERENCE TO RELATED APPLICATION

This application claims the benefit of Korean Patent Application No. 10-2013-0135452, filed on, Nov. 8, 2013, which is hereby incorporated by reference as if fully set forth herein.

TECHNICAL FIELD

The present application relates to an exterior décor panel for a home appliance in which a pattern is formed on a surface of a metal sheet and a method of manufacturing the same.

BACKGROUND

For manufacturing of metal sheets used as exterior décor panels for home appliances, there are various methods of forming a pattern to provide surfaces of the metal sheets with aesthetic effects, such as film attachment, printing, etching, rolling, and the like.

Among the aforementioned methods, attachment of a patterned film to a surface of a metal sheet can include attaching a film having various precise patterns on the appliance. Printing of a pattern on a surface of a metal sheet can include silkscreen printing, gravure printing or the like.

Etching and rolling differ from attachment of a film to or formation of a printing layer on a surface of a metal sheet in that a pattern is formed by directly processing a metal sheet. In the case of etching, after masking a surface of a metal sheet by photolithography, an unmasked patterned portion of the metal sheet may be etched using an etching solution. In the case of rolling, as a metal sheet passes through a rolling apparatus including a roller provided with a convex stereoscopic pattern, a stereoscopic pattern is formed on a front surface of the metal sheet. Rolling pressure of about 50~60 tons may be required in some cases to form a pattern on a front surface of a metal sheet, such as a stainless steel, by rolling the front surface.

Brilliant surfaces may be acquired by polishing surfaces of fastening members, such as bolts and nuts, or metal workpieces, such as photo composers. Surface polishing techniques include mechanical polishing using a grinder as well as electrolytic-polishing in which current is applied to a workpiece dipped in an electrolytic bath.

SUMMARY

Accordingly, the present application is directed to an exterior décor panel for a home appliance and a method of manufacturing the same.

One object of the present application is to provide an exterior décor panel for a home appliance and a method of manufacturing the same in which a pattern is formed on a surface of a metal sheet using electrolytic-polishing.

Additional advantages, objects, and features will be set forth in part in the description which follows and in part will become apparent to those having ordinary skill in the art upon examination of the following or may be learned from practice. The objectives and other advantages may be realized and attained by the structure particularly pointed out in the written description and claims hereof as well as the appended drawings.

According to one aspect, a method of manufacturing an exterior décor panel for a home appliance includes laminating a photosensitive dry film on a front surface of a metal sheet, the photosensitive dry film having a higher etch resistance than the metal sheet against an electrolytic solution, photo-masking the photosensitive dry film attached to the metal sheet to create a pattern having a minimum width of 0.1 mm in the photosensitive dry film to thereby expose the front surface of the metal sheet corresponding to the pattern in the photosensitive film, electrolytic-polishing the photo-masked metal sheet by dipping the photo-masked metal sheet in an electrolytic bath to allow the electrolytic solution to contact the exposed front surface of the metal sheet and form the pattern in the front surface of the metal sheet, and performing post-treatment on the metal sheet, the post-treatment including washing and removing the photosensitive dry film.

Implementations of this aspect may include one or more of the following features. For example, the photo-masking may include disposing a patterned output film on the photosensitive dry film, performing ultraviolet (UV) exposure of the photosensitive dry film to form the pattern in the photosensitive dry film, and developing the photosensitive dry film to remove an unexposed portion of the photosensitive dry film. The photo-masking may include performing primary washing of the metal sheet in an acetic acid bath to remove a developing solution used in developing the photosensitive dry film. The manufacturing method may include removing impurities from the metal sheet using an aqueous alkali solution prior to the laminating. The metal sheet used during the manufacturing method may be composed of stainless steel or aluminum. The metal sheet may be composed of stainless steel, and the electrolytic-polishing may include applying a voltage within a range of 0.4 V to 0.9 V to the metal sheet for a time between 2 to 6 minutes. The method may include performing secondary washing of the metal sheet using water in a wash bath at least one time after the electrolytic-polishing. The performing post-treatment may include peeling off the dry film by dipping the metal sheet in an acetic acid bath, and neutralizing the metal sheet using an alkali solution. The performing post-treatment may include performing tertiary washing of the metal sheet using water, and drying the metal sheet using hot air.

In the manufacturing method according to this aspect, the electrolytic-polishing may include providing a jig configured to secure the metal sheet dipped in the electrolytic bath. The jig may include an anode frame having a shape corresponding to an edge of the metal sheet, the anode frame being configured to support a rear surface of the metal sheet, a cathode frame spaced apart from the anode frame by a prescribed distance, the cathode frame being formed of a sheet having the same shape as the metal sheet, and a plurality of connection frames connected between the anode frame and the cathode frame to maintain the distance between the anode frame and the cathode frame. The connection frames may be configured to support a lower side and both lateral sides of the metal sheet seated between the anode frame and the cathode frame. The electrolytic-polishing may include providing the jig that further includes a hook extending upward from the cathode frame. The hook may be configured to be caught by a holder provided at the top of the electrolytic bath. The electrolytic-polishing may include providing the jig in which the distance between the anode frame and the cathode frame is within a range of 20 mm to 30 mm. The electrolytic-polishing the photo-masked metal sheet may include forming the pattern that is brilliant.

According to another aspect, an exterior décor panel for a home appliance includes a metal sheet composed of stainless steel or aluminum, and a pattern having a minimum width of 0.1 mm etched into the metal sheet by electrolytic-polishing. The pattern is formed by laminating a photosensitive dry film on a front surface of a metal sheet, the photosensitive dry film having a higher etch resistance than the metal sheet against an electrolytic solution, photo-masking the photosensitive dry film attached to the metal sheet to create a pattern having a minimum width of 0.1 mm in the photosensitive dry film to thereby expose the front surface of the metal sheet corresponding to the pattern in the photosensitive film, electrolytic-polishing the photo-masked metal sheet by dipping the photo-masked metal sheet in an electrolytic bath to allow the electrolytic solution to contact the exposed front surface of the metal sheet and form the pattern in the front surface of the metal sheet, and performing post-treatment on the metal sheet, the post-treatment including washing and removing the photosensitive dry film.

Implementations of this aspect may include one or more of the following features. For example, the pattern formed in the front surface of the metal sheet may be brilliant. The exterior décor panel may be configured to be used as an exterior material of a refrigerator door.

The details of one or more implementations described in this specification are set forth in the accompanying drawings and the description below. Other potential features and aspects of the present application will become apparent from the descriptions, the drawings and the claims.

DETAILED DESCRIPTION

An exterior decor panel for a home appliance according to the present application may have a film that is attached to a metal sheet and the metal sheet, from which a fine and precise pattern can be exposed by photo-masking, may be subjected to electrolytic-polishing to provide an exposed patterned portion with brilliance.

More specifically, while conventional electrolytic-polishing may be performed on the entire metal molded article to achieve a brilliant surface, according to the present application, only a patterned portion of a surface of a metal sheet may be subjected to electrolytic-polishing such that the surface is brilliant only at the patterned portion.

For example, as further detailed below, the exterior décor panel may be manufactured by attaching a film to a surface of a metal sheet, removing the attached film from a portion of the metal sheet corresponding to a pattern by photo-masking, and thereafter electrolytic-polishing only a portion of the metal sheet where the film has been attached so as to provide only the remaining portion of the metal sheet where the film has been removed with brilliance.

In the exterior décor panel according to the present application, the minimum width of a pattern formed by electrolytic-polishing may be 0.1 mm. Accordingly, a very fine and precise pattern may be acquired by photo-masking and the resulting pattern may exhibit brilliance by electrolytic-polishing.

The metal sheet used in the present application may be a metal plate, such as a stainless steel plate or an aluminum plate, and may be manufactured and prepared via a general molding process for a metal sheet.

Figure 1:
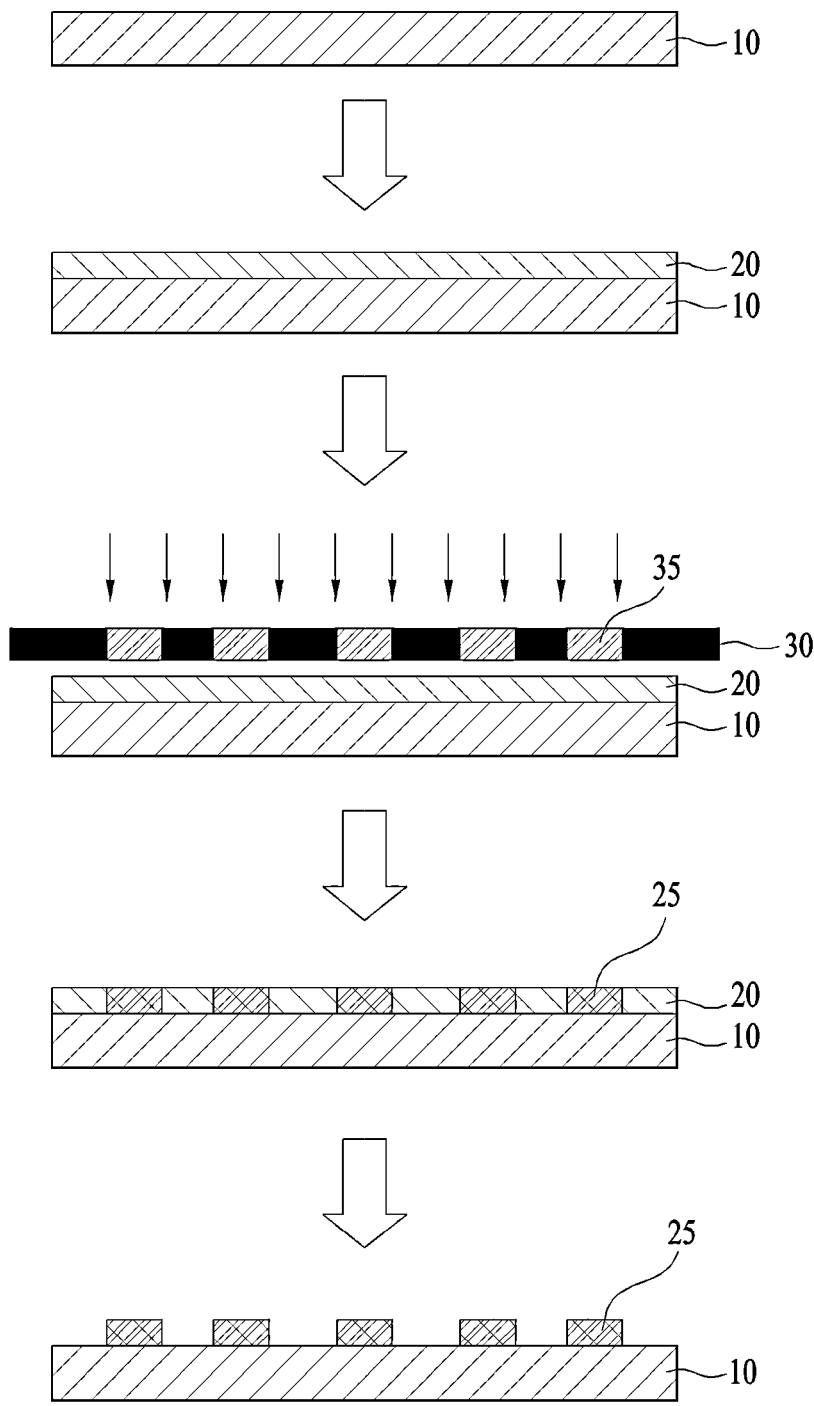
FIG. 1 is a schematic view illustrating an example photo-masking process of laminating a dry film on a metal sheet, arranging a pattern film thereon, and performing UV exposure and developing to form a pattern.

FIG. 1 illustrates a masking process of laminating a dry film on a metal sheet, disposing a patterned film on the dry film, and performing UV (ultraviolet) exposure and developing of the dry film to form a pattern.

As illustrated, a film 20 to be patterned is first laminated on a front surface of a prepared metal sheet 10. The film 20 is then patterned by photo-masking and, thereafter, will be introduced into an electrolytic bath while still being attached to the front surface of the metal sheet 10. Therefore, the film 20 can be a photosensitive dry film 20 that exhibits resistance against an electrolytic solution.

Upon photo-masking, as the dry film 20 is patterned and a patterned portion of the dry film 20 is removed to expose a portion of the metal sheet 10, the remaining portion of the metal sheet 10 except for the resulting pattern is masked. To create the mask, an output film 30 having a pattern portion 35 for passage of ultraviolet light is disposed on the dry film 20. When the dry film 20 is exposed to, for example, ultraviolet light through the pattern portion 35 of the output film 30, the exposed portion of the dry film 20 is cured.

Although the output film 30 may be disposed to come into contact with the dry film 20, the output film 30 may be spaced apart from the dry film 20 by a prescribed distance as exemplarily shown in FIG. 1.

Next, when an unexposed portion, i.e. an uncured portion of the dry film 20 is removed as the dry film 20 is washed using a developing solution, only the cured portion of the dry film 20 remains to form a masking portion 25 that exposes a portion of the metal sheet 10 corresponding to a desired pattern.

For electrolytic-polishing, the masked metal sheet 10 can be dipped in an electrolytic bath to form a brilliant pattern on an exposed front surface portion of the metal sheet 10.

Figure 2:
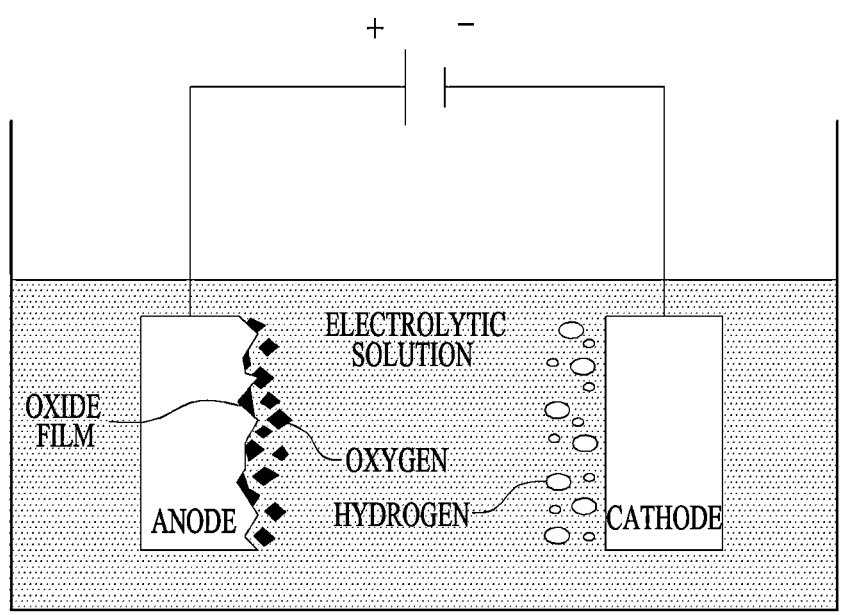
FIG. 2 is a schematic view illustrating the general principle of electrolytic-polishing.

FIG. 2 illustrates the general principle of electrolytic-polishing.

Electrolytic-polishing is a process in which fine bosses of a workpiece dissolve faster than fine recesses in an electrolytic solution to achieve a smooth surface of the workpiece. When electricity is applied to an anode that is a metal to be polished, bosses primarily dissolve to achieve a polished surface. The resulting surface may be a brilliant mirror surface.

As exemplarily shown in FIG. 2, a workpiece to be polished is connected to an anode and a material corresponding to the workpiece is connected to a cathode. Then, the workpiece and the corresponding material are dipped in an electrolytic solution and current is applied thereto. Then, as oxygen is generated from a surface of the workpiece connected to the anode to form an oxide film, smoothing of the surface is achieved. Hydrogen is generated from a surface of the corresponding material connected to the cathode.

Figure 3:
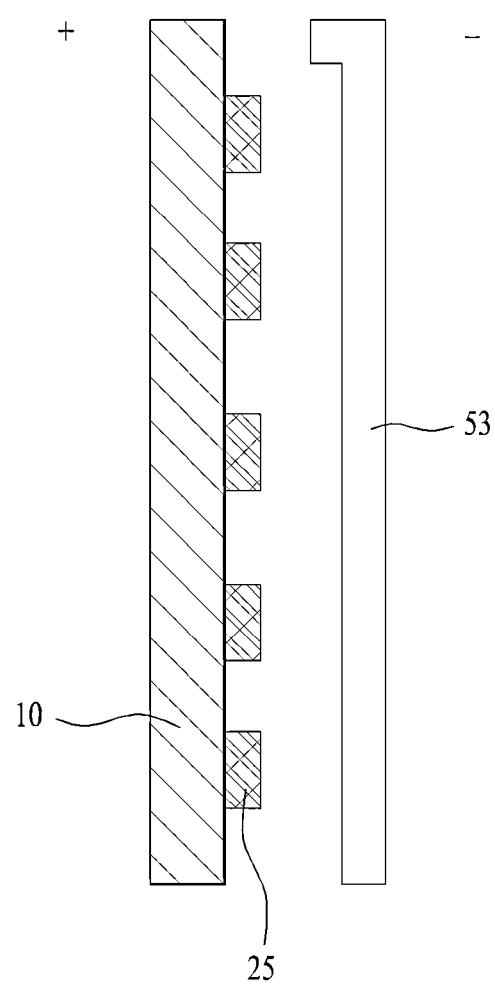
FIG. 3 is a schematic view illustrating an example arrangement of a masked metal sheet and a corresponding metal sheet dipped in an electrolytic bath.

FIG. 3 illustrates an arrangement of a masked metal sheet and a corresponding metal sheet dipped in an electrolytic bath according to the present application.

As illustrated, the metal sheet 10 including the masking portion 25, which can be formed by laminating a dry film on a surface of the metal sheet and performing UV exposure and developing of the dry film, is connected to an anode of the electrolytic bath, and a metal material 53 having a shape corresponding to the metal sheet 10 is connected to a cathode. Accordingly, an exposed surface of the metal sheet 10 not covered with the masking portion 25 is electro-polished, thereby forming a brilliant pattern on the resulting exposed surface portion of the metal sheet 10.

Figure 4:
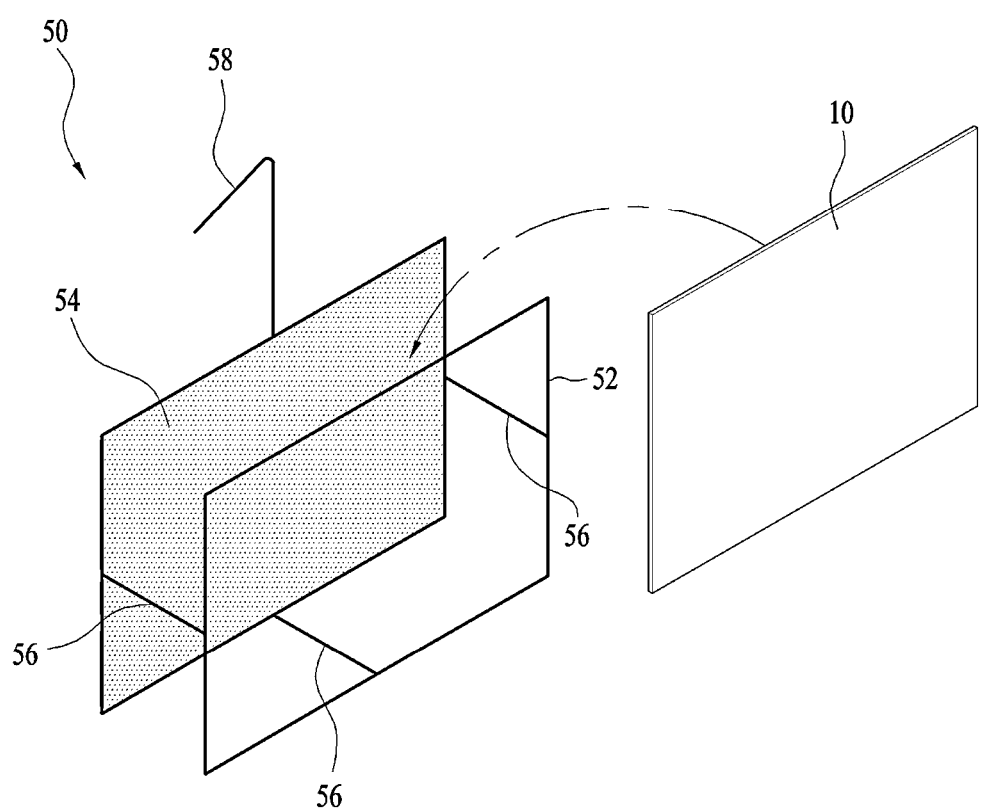
FIG. 4 is a perspective view illustrating an example shape of a jig that may be used in the electrolytic bath.

FIG. 4 illustrates an example shape of a jig that may be used in the electrolytic bath according to the present application.

As illustrated, the jig 50 is used to secure the metal sheet 10 dipped in the electrolytic bath during electrolytic-polishing. The jig 50 can include an anode frame 52 having a shape corresponding to an edge of the metal sheet 10, the anode frame 52 being configured to support a rear surface of the metal sheet 10, a cathode frame 54 spaced apart from the anode frame 52 by a prescribed distance, the cathode frame 54 being formed of a sheet having the same shape as the metal sheet 10, and a plurality of connection frames 56 connected between the anode frame 52 and the cathode frame 54 to maintain the distance therebetween, the connection frames 56 being configured to support a lower side and both lateral surfaces of the metal sheet 10.

The anode frame 52 may take the form of a rectangular wire corresponding to the metal frame 10 that primarily has a rectangular shape. The cathode frame 54 can be made using a metal sheet having the same shape as the metal sheet 10 to be inserted therein and is spaced apart from the anode frame 52 by a prescribed distance with the connection frames 56 interposed therebetween.

The metal sheet 10 to be inserted between the anode frame 52 and the cathode frame 54 is, in use, oriented such that the masked front surface of the metal sheet 10 faces the cathode frame 54 and the opposite rear surface of the metal sheet 10 comes into contact with an inner side of the anode frame 52.

The cathode frame 54 may be configured to cover the inserted metal sheet 10 and, thus, this type of jig 50 may be referred to as a closed type jig. Alternatively, in the case of an open type jig, the cathode frame 54 can take the form of a frame having an inner opening, similar to the anode frame 52. The closed type jig may ensure more uniform electrolytic-polishing throughout a large area metal sheet than the open type jig.

The connection frames 56 may be connected at a plurality of positions between the anode frame 52 and the cathode frame 54, more particularly, at the lower and both lateral sides of the metal sheet 10. The connection frames 56 can serve to maintain a distance between the anode frame 52 and the cathode frame 54 and to support the lower side and both lateral sides of the inserted metal sheet 10.

For example, when the metal sheet 10 for electrolytic-polishing is a rectangular sheet of 2000 mm in length and 1200 mm in width, the anode frame 52 and the cathode frame 54 may have a rectangular shape and be slightly larger than the metal sheet 10 to allow the metal sheet 10 to be insertion and seated between the anode frame 52 and the cathode frame 54. In this case, among the connection frames 56, a distance between the connection frames 56 at both lateral sides of the metal sheet 10 should slightly exceed 2000 mm.

In addition, the jig 50 may further include a hook 58 that extends upward from the cathode frame 54 so as to be caught by a holder provided at the top of the electrolytic bath.

It may be desirable that an object for electrolytic-polishing be completely dipped in an electrolytic solution of the electrolytic bath while being suspended in the electrolytic solution rather than coming into contact with the bottom of the electrolytic bath. For this reason, the holder by which the jig used to secure the object for electrolytic-polishing is caught may be provided at a desired position of the top of the electrolytic bath. The hook 58 may extend upward from the cathode frame 54 that serves as a cathode.

When the metal sheet 10 is inserted into the jig 50 and the hook 58 is caught by the holder of the electrolytic bath, the anode frame 52 may be tilted to be located below the cathode frame 54 due to the center of gravity thereof. Accordingly, the metal sheet 10 inserted into the jig 50 may be naturally moved to a location where it comes into contact with the anode frame 52. As such, an appropriate distance between the metal sheet 10 and the cathode frame 54 may be maintained. For example, distance between the anode frame 52 and the cathode frame 56 may be within a range of 20 mm to 30 mm.

Upon electrolytic-polishing of a large size metal sheet of 2000 mm in length and 1200 mm in width, an excessive distance between the metal sheet 10 corresponding to the anode and the cathode frame 54 may cause insufficient electrolytic-polishing and an extremely small distance may cause excessive electrolytic-polishing. Accordingly, appropriate electrolytic-polishing may be performed by appropriately adjusting a distance between the anode frame 52 and the cathode frame 56 within a range of 20 mm to 30 mm.

FIG. 4 shows the jig 50 for electrolytic-polishing of a rectangular metal sheet of 2000 mm in length and 1200 mm in width. A distance between the anode frame 52 and the cathode frame 54 may be, for example, 25 mm, and it will be appreciated from FIG. 4 that the distance between the anode frame 52 and the cathode frame 54 is exaggerated for clarity.

Figure 5:
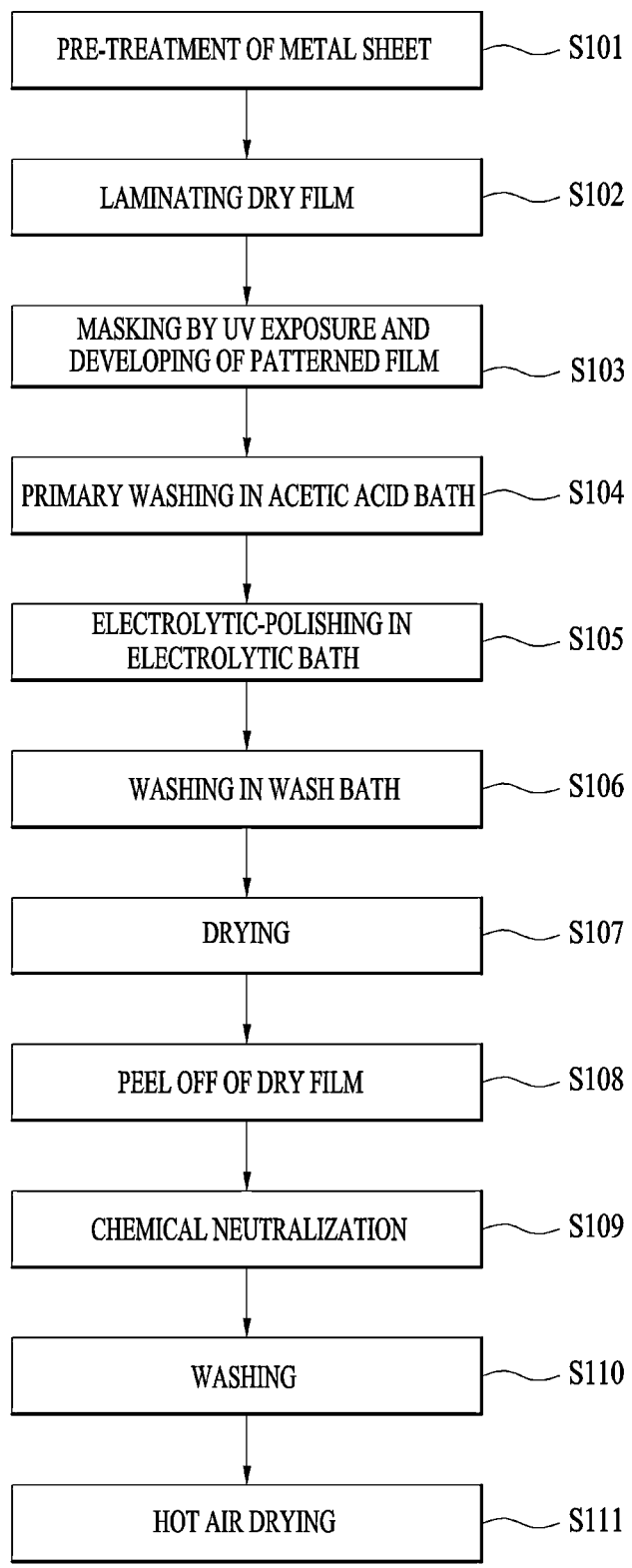
FIG. 5 is a flowchart showing an example method of manufacturing an exterior decor panel for a home appliance.

FIG. 5 is a flowchart showing a method of manufacturing an exterior decor panel for a home appliance in detail according to the present application.

An example method of manufacturing the exterior decor panel for the home appliance according to the present application includes: laminating a photosensitive dry film that can resist an electrolytic solution on a front surface of a metal sheet; photo-masking the dry film attached to the metal sheet to expose a front surface portion of the metal sheet corresponding to a pattern having the minimum width of 0.1 mm; electrolytic-polishing the resulting masked metal sheet by dipping the metal sheet in an electrolytic bath to form a brilliant pattern on the exposed front surface portion; and performing post-treatment including washing and peel-off of the dry film.

Referring to FIG. 5, a metal sheet to construct an exterior décor panel is manufactured and prepared by pre-treatment (S101). The metal sheet can be manufactured by forming a raw metal material into a coil and performing cold rolling of the coiled metal material. Thereafter, by performing shape correction and shearing in a width direction and in a longitudinal direction, a metal sheet having prescribed dimensions and shape may be formed.

To provide the entire metal sheet with a brilliant surface, after cold rolling, the metal sheet may further be subjected to bright annealing in which, for example, the metal sheet is thermally treated at a temperature of 1100° C. or more under an $N_2$ gas atmosphere for pickling a surface of the metal sheet. In addition, after shape correction, the surface of the metal sheet may be polished for hairline finishing.

Since the manufactured metal sheet is often contaminated by impurities, such as oily impurities, etc., during forming, the impurities may be removed by treating the metal sheet using a solvent such as an aqueous alkali solution.

As described above, the photosensitive dry film that can resist the electrolytic solution is laminated on the prepared metal sheet (S102).

Next, upon masking, after a patterned output film is disposed on the metal sheet having the laminated dry film, the dry film is subjected to UV exposure to form a pattern in the dry film and then subjected to developing using a developing solution to remove an unexposed portion of the dry film (S103).

As exemplarily shown in FIG. 1, the output film 30 can have the pattern portion 35. As ultraviolet light passes through the pattern portion 35, a portion of the dry film 20 corresponding to the pattern portion 35 is cured to form the masking portion 25.

Therefore, the pattern portion 35 of the output film 30 serves to expose a patterned portion of the metal sheet to be electro-polished while preventing electrolytic-polishing of the remaining portion of the metal sheet.

After masking, since the developing solution used to develop the dry film may remain on the resulting masked metal sheet, the metal sheet can be subjected to primary washing in an acetic acid bath to remove the developing solution (S104).

Next, the washed metal sheet is mounted to a jig that is configured to be caught by a holder of the electrolytic bath and is dipped in the electrolytic bath, thereby being subjected to electrolytic-polishing under prescribed electrolytic conditions (S105).

During primary washing in the acetic acid bath, it may be convenient to wash the metal sheet in a state in which the metal sheet is mounted to the jig. Therefore, the metal sheet may be mounted to the jig prior to washing. In such a mounted state, the metal sheet may be subjected to primary washing followed by electrolytic-polishing.

A metal used in the manufacture of the exterior décor panel according to the present application can be stainless steel or aluminum, among others.

The metal sheet, which has a brilliant pattern acquired by electrolytic-polishing, can be used as an exterior décor panel for a home appliance. Accordingly, the sheet may be formed of a material that is suitable for electrolytic-polishing and has high durability, such as high corrosion-resistance and scratch-resistance. The aforementioned stainless steel or aluminum may be appropriate as this material. In particular, stainless steel 201, 304 or 430 may be used.

In the case of stainless steel 201 and 430, experiment has shown that they can allow formation of a precise pattern when current having a density of 0.3 A/cm$^2$ is applied at voltage of 0.5 V for 2 minutes and 30 seconds upon electrolytic-polishing.

In the case of stainless steel 304, experiment has shown that it allows formation of a precise pattern when current having a density of 12787 µA/cm$^2$ is applied at voltage of 0.83 V for 5 minutes upon electrolytic-polishing.

As described above, although there are various kinds of stainless steel and conditions of the respective kinds of stainless steel may be different, a voltage of 0.4 V to 0.9 V may generally be applied for 2 minutes to 6 minutes upon electrolytic-polishing of a stainless steel sheet.

The electrolytic solution used for electrolytic-polishing may include one of phosphoric acid, sulfuric acid, hydrochloric acid and nitric acid and combinations thereof. Components of the electrolytic solution may vary according to a material of the metal sheet.

Following electrolytic-polishing, the metal sheet can be subjected to secondary washing using water in a wash bath to remove the electrolytic solution adhered thereto prior to peel-off of the dry film (S106). Then, the metal sheet is dried (S107).

Once electrolytic-polishing has been completed, the metal sheet can be dipped in an acetic acid bath to peel off the dry film as a masking film (S108). Thereafter, acetic acid adhered to the metal sheet may be neutralized with a chemical such as an alkali solution (S109).

After neutralization, the metal sheet can be subjected to tertiary washing using water to remove the chemical and the like (S110). Then, once the metal sheet is dried using hot air (S111), an exterior décor panel having a brilliant pattern can be achieved.

Drying the metal sheet using hot air can prevent spots from being formed on the surface of the metal sheet, which can occur when rapidly drying the metal sheet.

Figure 6:
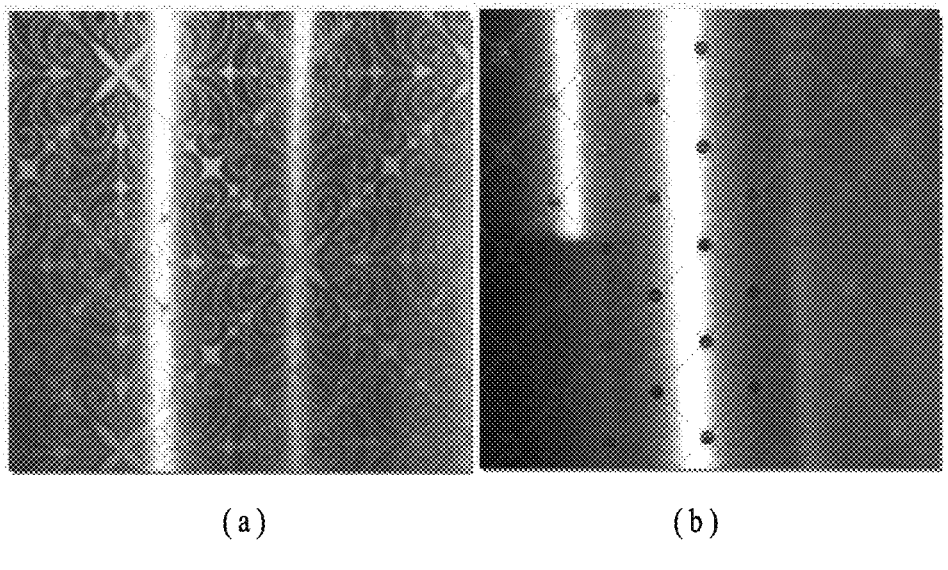
FIGS. 6(a) and 6(b) are pictures illustrating example brilliant patterns formed on a surface of a metal sheet.

FIGS. 6(a) and 6(b) show pictures of example brilliant patterns formed on a surface of a metal sheet according to the present application. More specifically, FIGS. 6(a) and 6(b) show different shapes of patterns. In the pictures, bright portions represent a brilliant patterned portion acquired by electrolytic-polishing.

In the exterior décor panel according to the present application, the minimum width of a pattern acquired by electrolytic-polishing may be 0.1 mm.

Assuming that some portions of the pattern acquired by the present application can take the form of lines having a small width, the minimum width of a precise pattern that may be acquired by electrolytic-polishing may be within 0.02 mm.

However, since the minimum width of the brilliant pattern to allow the brilliant pattern to be distinguished from a surrounding portion not subjected to electrolytic-polishing with the naked eye may be around 0.1 mm, a patterned portion having a width less than 0.1 mm may not be distinguished with the naked eye and the resulting fine pattern may have difficulty in achieving a desired degree of precision. Therefore, the minimum width of the resulting pattern may be 0.1 mm or more.

The exterior décor panel according to the present application may be used as an exterior décor material for a variety of home appliances, such as a refrigerator, a water purifier, a washing machine, a drying machine, an air conditioner, a television, a cellular phone and any of various others.

In the case of a refrigerator, the exterior décor panel may be attached to a front surface of a door and thus have a considerably larger area than that of an exterior décor panel that will be attached to a cellular phone.

Upon manufacture of such a large area exterior décor panel to be attached to a refrigerator door according to the present application, it may be necessary to perform photomasking and electrolytic-polishing with an increased degree of precision, in order to provide the entire surface of the exterior décor panel with a uniform and precise pattern.

In particular, it may be necessary to use the above-described closed type jig in electrolytic-polishing and to accurately adjust several electrolytic conditions, such as applied voltage, current density, electrolytic-polishing time and the like.

A depth of the patterned portion formed by electrolytic-polishing according to the present application may be too small so as to be not distinguishable from an unpolished adjacent portion of the front surface of the metal sheet with the naked eye. However, due to the fact that the patterned portion defines a brilliant mirror surface owing to uniform and precise electrolytic-polishing, the brilliant precise pattern may be distinguished from an adjacent portion with the naked eye.

As is apparent from the above description, with an exterior décor panel for a home appliance and a method of manufacturing the same according to the present application, a fine and precise pattern may be formed on a surface of a metal sheet by photo-masking and electrolytic-polishing and a surface of the pattern may be brilliant.

In addition, it is possible to achieve a precise brilliant pattern with a simplified manufacturing process as compared to conventional patterning such as etching and the like.

Although the exemplary implementations have been illustrated and described as above, of course, it will be apparent to those skilled in the art that the present application is not limited to the above described particular implementations, and various modifications and variations can be made in the present application without departing from the spirit or scope of the present application, and the modifications and variations should not be understood individually from the viewpoint or scope of the present application.

What is claimed is:

1. A method of manufacturing an exterior décor panel for a home appliance, the method comprising:
    laminating a photosensitive dry film on a front surface of a metal sheet, the photosensitive dry film having a higher etch resistance than the metal sheet against an electrolytic solution;
    photo-masking the photosensitive dry film attached to the metal sheet to create a pattern having a minimum width of 0.1 mm in the photosensitive dry film, thereby exposing the front surface of the metal sheet corresponding to the pattern in the photosensitive film;
    electrolytic-polishing the photo-masked metal sheet by dipping the photo-masked metal sheet in an electrolytic bath to allow the electrolytic solution to contact the exposed front surface of the metal sheet and form the pattern in the front surface of the metal sheet; and
    performing post-treatment on the metal sheet, the post-treatment including washing and removing the photosensitive dry film,
    wherein the photo-masking comprises:
        disposing a patterned output film over the photosensitive dry film,
        performing ultra-violet (UV) exposure of the photosensitive dry film to form the pattern in the photosensitive dry film, and
        developing the photosensitive dry film to remove an unexposed portion of the photosensitive dry film, and
    wherein the electrolytic-polishing includes providing a jig configured to secure the metal sheet dipped in the electrolytic bath, the jig comprising:
        an anode frame having a shape corresponding to an edge of the metal sheet and being configured to support a rear surface of the metal sheet,
        a cathode frame spaced apart from the anode frame by a prescribed distance and made of a sheet having the same shape as the metal sheet, and
        a plurality of connection frames configured to connect the anode frame to the cathode frame, maintain the prescribed distance between the anode frame and the cathode frame, and support a lower side and both lateral sides of the metal sheet seated between the anode frame and the cathode frame.

2. The method according to claim 1, wherein the photo-masking further comprises performing primary washing of the metal sheet in an acetic acid bath to remove a developing solution used in developing the photosensitive dry film.

3. The method according to claim 1, further comprising removing impurities from the metal sheet using an aqueous alkali solution prior to the laminating.

4. The method according to claim 1, wherein the metal sheet is composed of stainless steel or aluminum.

5. The method according to claim 1, wherein the metal sheet is composed of stainless steel, and wherein the electrolytic-polishing includes applying a voltage within a range of 0.4 V to 0.9 V to the metal sheet for a time between 2 to 6 minutes.

6. The method according to claim 2, further comprising performing secondary washing of the metal sheet using water in a wash bath at least one time after the electrolytic-polishing.

7. The method according to claim 6, wherein the performing post-treatment comprises:
    peeling off the dry film by dipping the metal sheet in an acetic acid bath; and
    neutralizing the metal sheet using an alkali solution.

8. The method according to claim 7, wherein the performing post-treatment comprises:
    performing tertiary washing of the metal sheet using water; and
    drying the metal sheet using hot air.

9. The method according to claim 1, wherein the electrolytic-polishing includes providing the jig that further comprises a hook extending upward from the cathode frame, the hook being configured to be caught by a holder provided at the top of the electrolytic bath.

10. The method according to claim 9, wherein the electrolytic-polishing includes providing the jig in which the prescribed distance between the anode frame and the cathode frame is within a range of 20 mm to 30 mm.

11. The method according to claim 3, wherein the electrolytic-polishing the photo-masked metal sheet includes forming the pattern that is brilliant.

* * * * *